United States Patent
Itoh et al.

(10) Patent No.: US 8,407,629 B2
(45) Date of Patent: Mar. 26, 2013

(54) PATTERN VERIFICATION-TEST METHOD, OPTICAL IMAGE INTENSITY DISTRIBUTION ACQUISITION METHOD, AND COMPUTER PROGRAM

(75) Inventors: Masamitsu Itoh, Kanagawa (JP); Satoshi Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/491,639

(22) Filed: Jun. 8, 2012

(65) Prior Publication Data

US 2012/0250011 A1 Oct. 4, 2012

Related U.S. Application Data

(62) Division of application No. 12/487,554, filed on Jun. 18, 2009, now Pat. No. 8,219,942.

(30) Foreign Application Priority Data

Jun. 20, 2008 (JP) ................................. 2008-162508

(51) Int. Cl.
*G06F 17/50* (2006.01)
(52) U.S. Cl. .................. 716/50; 716/51; 355/67; 703/2; 430/5
(58) Field of Classification Search ............ 716/50, 716/51; 355/67; 703/2; 430/5
See application file for complete search history.

(56) References Cited

U.S. PATENT DOCUMENTS

| | | | |
|---|---|---|---|
| 5,633,713 A * | 5/1997 | Tanaka et al. ............... | 356/521 |
| 6,522,386 B1 * | 2/2003 | Nishi ............................ | 355/52 |
| 6,641,981 B1 * | 11/2003 | Kaneko et al. ............... | 430/311 |
| 6,990,225 B2 | 1/2006 | Tanaka et al. | |
| 7,313,781 B2 | 12/2007 | Asano et al. | |
| 7,321,433 B2 | 1/2008 | Larsen et al. | |
| 7,559,047 B2 | 7/2009 | Miyamoto et al. | |
| 7,596,776 B2 * | 9/2009 | Tanaka et al. ............... | 716/56 |
| 7,713,889 B2 | 5/2010 | Hirukawa | |
| 7,875,849 B2 | 1/2011 | Fukuda et al. | |
| 2003/0038931 A1 | 2/2003 | Toyoda et al. | |
| 2004/0122636 A1 | 6/2004 | Adam | |
| 2005/0153217 A1 | 7/2005 | Izuha et al. | |
| 2006/0181690 A1 | 8/2006 | Nishinaga et al. | |
| 2007/0032896 A1 | 2/2007 | Ye et al. | |
| 2007/0213962 A1 | 9/2007 | Adam | |
| 2007/0234269 A1 * | 10/2007 | Tanaka et al. ............... | 716/21 |
| 2008/0028361 A1 | 1/2008 | Yamanaka et al. | |
| 2008/0059128 A1 | 3/2008 | Tejnil | |
| 2008/0151210 A1 | 6/2008 | Tsujita | |
| 2008/0209386 A1 | 8/2008 | Naka | |
| 2009/0123058 A1 | 5/2009 | Ito | |

FOREIGN PATENT DOCUMENTS

JP 4100038 3/2008

OTHER PUBLICATIONS

Kariya et al., "Reticle SEM Specification Required for Lithography Simulation," Proceedings of SPIE (2005), 5853:550-555.

\* cited by examiner

*Primary Examiner* — Naum Levin
(74) *Attorney, Agent, or Firm* — Finnegan, Henderson, Farabow, Garrett & Dunner, L.L.P.

(57) ABSTRACT

A pattern verification-test method according to an embodiment of the present invention includes: deriving an illumination condition at a verification-test subject position in a photomask surface of a mask pattern as a verification or a test subject based on the verification-test subject position and illumination condition information about a distribution of an illumination condition in a photomask surface of exposure light incident on the mask pattern, performing lithography simulation on the mask pattern based on the derived illumination condition and the mask pattern, and verifying or testing the mask pattern based on a result of the lithography simulation.

6 Claims, 10 Drawing Sheets

SEM IMAGE

12

CONTOUR DATA

13

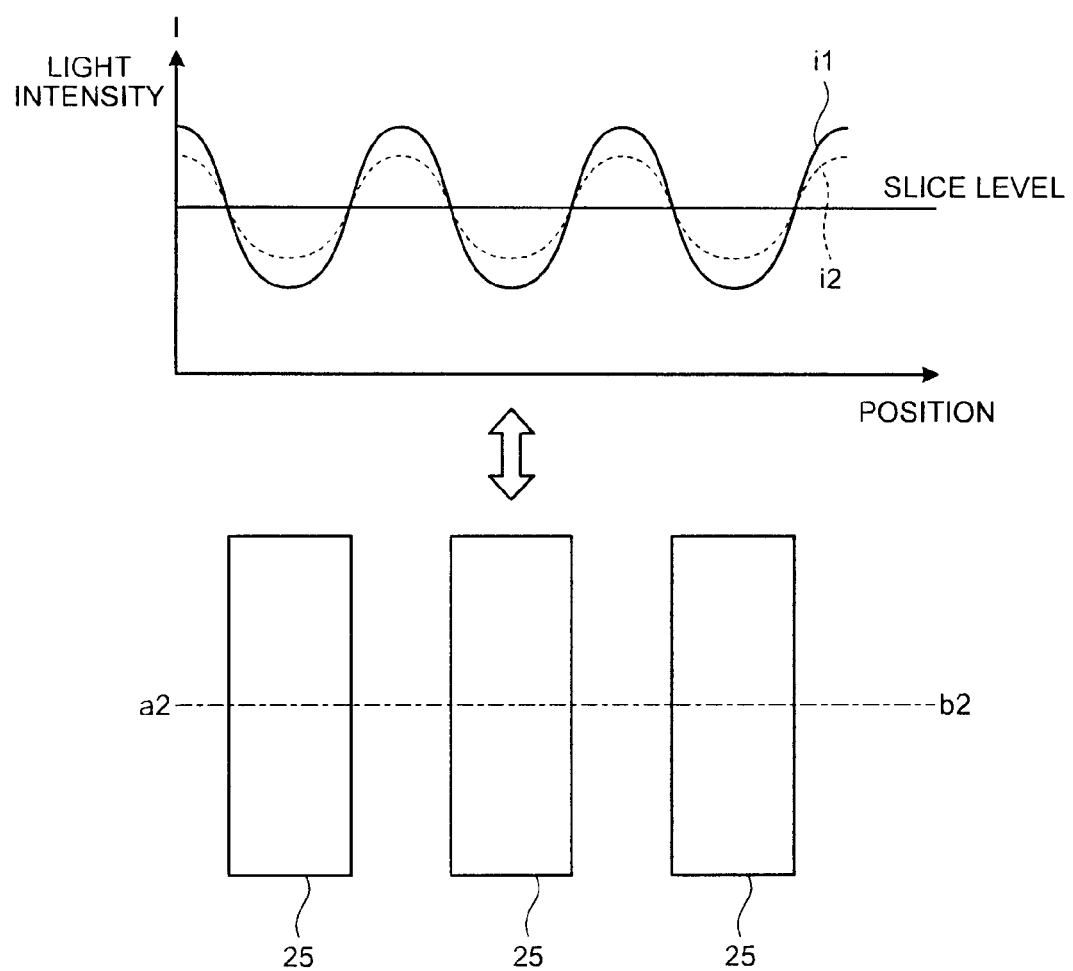

PATTERN VERIFICATION-TEST METHOD, OPTICAL IMAGE INTENSITY DISTRIBUTION ACQUISITION METHOD, AND COMPUTER PROGRAM

This is a division of application Ser. No. 12/487,554, filed Jun. 18, 2009, now U.S. Pat. No. 8,219,942, which is incorporated herein by reference.

CROSS-REFERENCE TO RELATED APPLICATIONS

This application is based upon and claims the benefit of priority from the prior Japanese Patent Application No. 2008-162508, filed on Jun. 20, 2008; the entire contents of which are incorporated herein by reference.

BACKGROUND OF THE INVENTION

1. Field of the Invention

The present invention relates to a pattern verification-test method, an optical image intensity distribution acquisition method, and a computer program product.

2. Description of the Related Art

In a recent semiconductor manufacturing process, a problem in a photolithography process has become more significant. This is because as the size of a semiconductor device become smaller, finer photolithography process is required. The design rule of a semiconductor device has become as small as 45 nanometers, and the pattern dimensional accuracy that is required to be controlled is 3 nanometers or smaller. Furthermore, because optical proximity correction (OPC) is performed on a mask pattern, the mask pattern ends up having an extremely complicated shape. Therefore, a conventionally performed one-dimensional uniformity test such as measurement of a pattern line width or measurement of a hole diameter is insufficient, and two-dimensional control is demanded.

Dimensional management of a mask pattern based on an image of a mask pattern acquired with a scanning electron microscope (SEM) is one example of the two-dimensional control methods. In this method, contour of a mask pattern is extracted from the acquired image of the mask pattern, lithography simulation (transferability evaluation) is performed on the contour, and it is judged whether desired lithography latitude can be obtained. Thus, the mask pattern is tested whether it has a desired dimension. An advantage of the dimensional control method using a SEM is that the facon of the mask pattern can be determined under a condition that the mask pattern is exposed on a wafer (the condition extremely similar to that of actual use), and that necessary and sufficient management can be performed without being excessively strict or lenient (M. Kariya et al., "Reticle SEM Specfications Required for Lithography Simulation", Proceedings of SPIE Vol. 5853 550-555, 2005).

However, the accuracy of the conventional technique cannot meet the demand of the recent strict dimensional control of a mask pattern. This is because the conventional technique has ignored the influence of irregularity of illumination from a wafer exposure apparatus on wafer exposure. For example, when irradiating a transmissive mask with exposure light, the shape of exposure light illuminating the mask (the illumination shape) should be uniform at any position in the mask surface. However, in fact, in the case of an orbicular zone illumination for example, although the illumination shape is an orbicular zone close to a substantially perfect circle near the center of the mask, the illumination shape is distorted to be an elliptical shape at a position closer to the periphery of the mask. Accordingly, the results (pattern dimensions) of performing lithography simulation with an ideal illumination, and of exposing the mask pattern on a wafer actually do not match with each other in some cases.

EUV lithography using a reflective mask has a problem similar to that of the lithography using a transmissive mask. In a case of the EUV lithography, an incidence direction of EUV light incident on a mask is different depending on a position of the mask. However, in the conventional technique, the same optical parameters are used in a mask surface for lithography simulation. Thus, an error occurs in lithography simulation because although the incidence direction (the illumination shape) of EUV light is different in a mask surface, the position in the mask surface from which a SEM image is acquired is ignored. Accordingly, the pattern dimension of a mask pattern of a transmissive mask and a reflective mask cannot be tested accurately.

Not only in testing a mask pattern formed on a photomask, but also in performing mask data process such as optical proximity correction in designing of a mask pattern, the influence of irregularity of an illumination shape has not been considered. Accordingly, an accurate optical image intensity distribution cannot be obtained when lithography simulation is performed by using a mask pattern (data), and appropriate verification and designing of a mask pattern have not been possible.

BRIEF SUMMARY OF THE INVENTION

A pattern verification-test method according to an embodiment of the present invention comprises: deriving an illumination condition at a verification-test subject position in a photomask surface of a mask pattern as a verification or a test subject based on the verification-test subject position and illumination condition information about a distribution of an illumination condition in a photomask surface of exposure light with which an exposure apparatus irradiates the mask pattern; performing lithography simulation on the mask pattern based on the illumination condition at the verification-test subject position and the mask pattern; and verifying or testing the mask pattern based on a result of the lithography simulation.

An optical image intensity distribution acquisition method according to an embodiment of the present invention comprises: acquiring an optical image intensity distribution of exposure light incident on a wafer when a mask pattern is exposed on the wafer performing lithography simulation of an optical image intensity distribution of the mask pattern using illumination condition information about a distribution of an illumination condition in a photomask surface of exposure light with which an exposure apparatus irradiates the mask pattern.

A computer program product executable by a computer and having a computer readable recording medium includes a plurality of commands for lithography simulation according to an embodiment of the present invention, wherein the commands cause the computer to execute: acquiring an optical image intensity distribution of exposure light incident on a wafer when a mask pattern is exposed on the wafer, as a process of obtaining the optical image intensity distribution by lithography simulation, performing lithography simulation of an optical image intensity distribution of the mask pattern using illumination condition information about a distribution of an illumination condition in a photomask surface of exposure light with which an exposure device irradiates the mask pattern.

BRIEF DESCRIPTION OF THE DRAWINGS

FIG. 8 is a schematic for explaining a relationship between a mask pattern and an exposure margin;

DETAILED DESCRIPTION OF THE INVENTION

Exemplary embodiments of a pattern verification-test method, an optical image intensity distribution acquisition method, and a computer program will be explained in detail with reference to the drawings. The embodiments are not intended to limit the present invention.

First Embodiment

Figure 1:
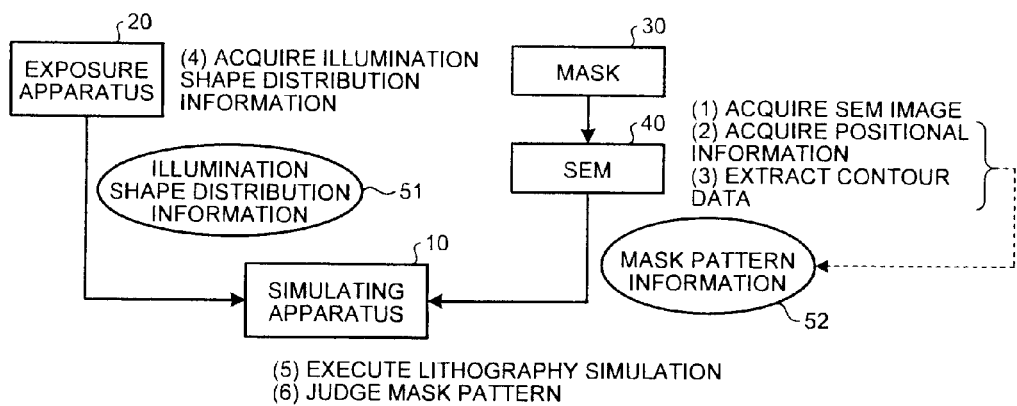
FIG. 1 is an explanatory schematic for explaining a concept of a mask pattern evaluation according to a first embodiment.

To begin with, a concept of a mask pattern evaluation according to a first embodiment will be explained. FIG. 1 is a block diagram for explaining the concept of the mask pattern evaluation according to the first embodiment. A mask 30 is a transmissive photomask used in exposure processing at a semiconductor device manufacturing step. An SEM 40 is a apparatus that images a mask pattern of the mask 30 and an exposure apparatus 20 is a scan type transmissive wafer exposure apparatus that performs exposure on a wafer (not shown) using the mask 30. The exposure apparatus 20 of the present embodiment performs exposure on a wafer, for example, using an ArF excimer laser light having a wavelength of 193 nanometers.

A simulating apparatus (lithography simulator) 10 calculates an optical image intensity distribution formed on a wafer at a lithography step using the mask 30, and obtains a shape of a pattern formed on the wafer based on the optical image intensity distribution. In this lithography simulation, a shape and a dimension of a resist pattern formed on a wafer when exposure processing is performed on a wafer using the mask 30 are obtained. When the lithography simulation is performed, exposure conditions necessary for the exposure processing (such as exposure amount and focus depth) are input as parameters of the simulation, and exposure margins (such as latitude of the exposure amount and latitude of the focus depth) are determined based on the shape and the dimension of the resist pattern that are obtained as a result.

The SEM 40 acquires an SEM image (a pattern image) of a mask pattern by imaging the mask pattern of the mask 30 (1). The SEM 40 associates a position on the mask 30 at which the SEM image is acquired (positional information), and the SEM image with each other (2). Furthermore, the SEM 40 extracts contour data (contour information) of the mask pattern from the SEM image (3). The SEM 40 associates the positional information and the contour data with each other. The information including the positional information and the contour data associated with each other is sent to the simulating apparatus 10 as mask pattern information 52.

The exposure apparatus 20 acquires a shape distribution of exposure light that illuminates the mask 30 in the mask surface (the illumination shape distribution at each position) as illumination shape distribution information (illumination condition information) 51 (4). The illumination shape distribution information 51 acquired by the exposure apparatus 20 is sent to the simulating apparatus 10.

The simulating apparatus 10 performs lithography simulation using the illumination shape distribution information 51 and the mask pattern information 52 (5). Thereby, the simulating apparatus 10 according to the present embodiment performs lithography simulation based on the illumination shape of the exposure light with which the exposure apparatus 20 irradiates the mask 30. The illumination shape of the exposure light with which the exposure apparatus 20 irradiates the mask 30 is not uniform in the mask 30 surface, and varies depending on the position (coordinates) in the mask 30 surface. Accordingly, the simulating apparatus 10 performs lithography simulation based on the illumination shape at each position of the mask pattern on which the lithography simulation is performed.

Furthermore, the simulating apparatus 10 tests whether desired lithography latitude is obtained based on a simulation result of the lithography simulation. Thereby, the simulating apparatus 10 judges whether the mask pattern of the mask 30 has a desired dimension (6).

Figure 2:
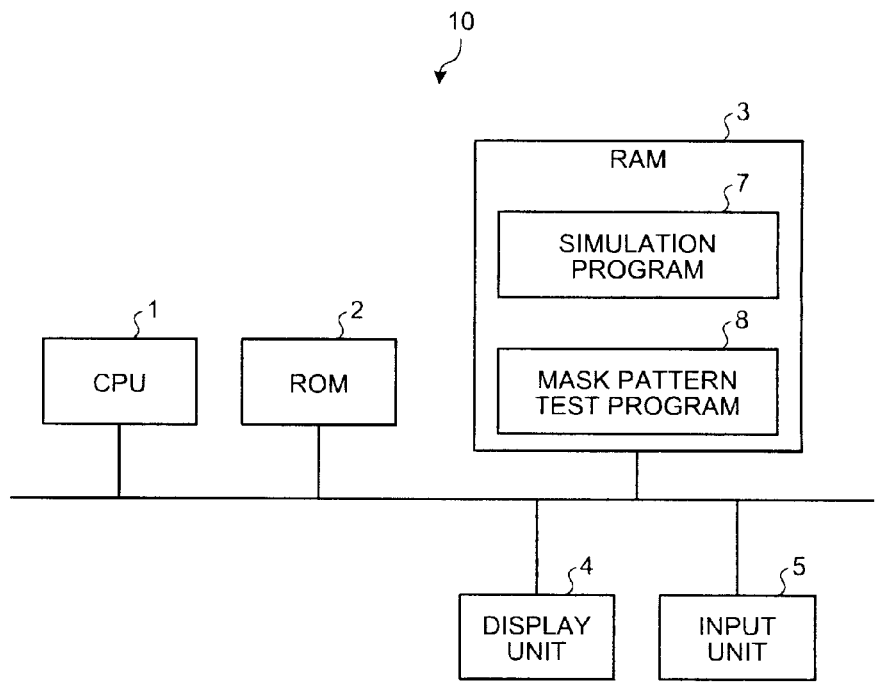
FIG. 2 is a schematic of a hardware configuration of a simulating apparatus according to the first embodiment shown in FIG. 1.

FIG. 2 is a schematic of a hardware configuration of the simulating apparatus according to the first embodiment. The simulating apparatus 10 is, for example, a computer that verifies and tests the mask pattern of the mask 30 (a pattern verification-test apparatus), and includes a central processing unit (CPU) 1, a read only memory (ROM) 2, a random access memory (RAM) 3, a display unit 4, and an input unit 5. In the simulating apparatus 10, the CPU 1, the ROM 2, the RAM 3, the display unit 4, and the input unit 5 are connected through bus lines.

Computer program products such as a simulation program 7 and a mask pattern test program (a mask pattern verification-test program) 8 are stored in the ROM 2, and are loaded to the RAM 3 through a bus line. The simulation program 7 is a computer program that simulates latitude and the like about exposure processing when a pattern is formed on a wafer using the mask 30. The latitude about the exposure processing is, for example, latitude of an exposure amount and latitude of a focus depth, and is defined based on a resist pattern dimension formed on a wafer by exposure with an optimum exposure amount at an optimal focus position. The latitude about the exposure processing may be defined based on a range of an exposure amount and a range of a focus depth that can provide a desired resist pattern dimension. The mask pattern test program 8 is a computer program that tests whether a mask pattern of the mask 30 has a desired dimension based on a simulation result of lithography simulation by the simulation program 7.

The display unit 4 is a display device such as a liquid crystal display monitor, and displays various types of information based on an instruction from the CPU 1. The display unit 4 displays, for example, the illumination shape distribution information 51, mask data about the mask 30, an SEM image, positional information, contour data, the mask pattern information 52, simulation results of lithography simulation, and verification and test results of a mask pattern (for example, dimensional test results).

The input unit 5 includes a mouse or a keyboard, and receives instruction information (instruction information necessary for lithography simulation) input by a user. The instruction information input to the input unit 5 is sent to the CPU 1. Moreover, the illumination shape distribution information 51, the mask pattern information 52, and the like are input through the input unit 5, and sent to the CPU 1, and the like.

The CPU 1 executes the simulation program 7 and the mask pattern test program 8 loaded to the RAM 3. Specifically, the simulating apparatus 10 executes various processing with the CPU 1 reading out the simulation program 7 and the mask pattern test program 8 from the ROM 2 in accordance with an instruction input by a user through the input unit 5, and deploying the programs in a program storage area in the RAM 3. The CPU 1 temporarily stores various types of data generated by the various processing in a data storage area formed in the RAM 3.

Figure 3:
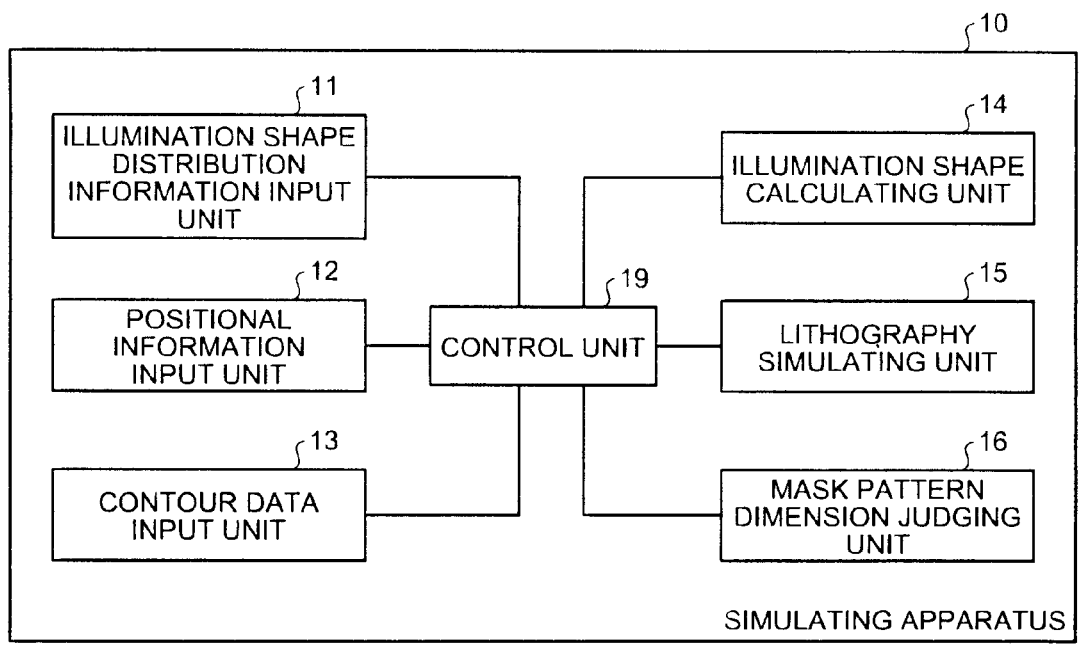
FIG. 3 is a functional block diagram of the simulating apparatus according to the first embodiment shown in FIG. 1.

FIG. 3 is a functional block diagram of a simulating apparatus according to the first embodiment. The simulating apparatus 10 includes an illumination shape distribution information input unit 11, a positional information input unit 12, a contour data input unit 13, an illumination shape calculating unit 14, a lithography simulating unit 15, a mask pattern dimension judging unit 16, and a control unit 19.

The illumination shape distribution information input unit 11 receives the illumination shape distribution information 51 detected by the exposure apparatus 20, and sends the information to the illumination shape calculating unit 14. The positional information input unit 12 receives positional information of the mask pattern information 52 acquired by the SEM 30, and sends the information to the illumination shape calculating unit 14. The simulating apparatus 10 performs lithography simulation on a portion with a small lithography margin (hereinafter, a "hot spot"). Accordingly, the positional information input unit 12 receives positional information of a hot spot to be tested (a test subject position).

The contour data input unit 13 receives contour data of the mask pattern information 52 acquired by the SEM 30, and sends the information to the lithography simulating unit 15. The contour data acquired by the SEM 30 is data extracted from an SEM image of a hot spot, and corresponds to the positional information received by the positional information input unit 12.

The illumination shape calculating unit 14 calculates an illumination shape corresponding to the positional information (the hot spot) based on the illumination shape distribution information 51 from the illumination shape distribution information input unit 11 and the positional information from the positional information input unit 12. The illumination shape calculating unit 14 sends the calculated illumination shape to the lithography simulating unit 15.

The lithography simulating unit 15 executes lithography simulation based on the illumination shape from the illumination shape calculating unit 14 and the contour data from the contour data input unit 13. The illumination shape and the contour data sent to the lithography simulating unit 15 are those of the hot spot. Accordingly, the lithography simulating unit 15 executes lithography simulation of the hot spot. The lithography simulating unit 15 executes lithography simulation using the simulation program 7. The lithography simulating unit 15 sends the simulation result to the mask pattern dimension judging unit 16.

The mask pattern dimension judging unit 16 judges whether the mask pattern of the mask 3 has a desired dimension based on the simulation result from the lithography simulating unit 15. The mask pattern dimension judging unit 16 performs dimensional judgment on the mask pattern using the mask pattern test program 8.

The control unit 19 controls the illumination shape distribution information input unit 11, the positional information input unit 12, the contour data input unit 13, the illumination shape calculating unit 14, the lithography simulating unit 15, and the mask pattern dimension judging unit 16.

The simulation program 7 and the mask pattern test program 8 executed by the simulating apparatus 10 according to the present embodiment have modular configurations including the above-described units (the illumination shape distribution information input unit 11, the positional information input unit 12, the contour data input unit 13, the illumination shape calculating unit 14, the lithography simulating unit 15, the mask pattern dimension judging unit 16, and the control unit 19). The units are loaded to a main storage device, and the illumination shape distribution information input unit 11, the positional information input unit 12, the contour data input unit 13, the illumination shape calculating unit 14, the lithography simulating unit 15, the mask pattern dimension judging unit 16, and the control unit 19 are provided on the main storage device.

Although the simulating apparatus 10 includes the illumination shape distribution information input unit 11, the positional information input unit 12, and the illumination shape calculating unit 14 in this case, the simulating apparatus 10 may not have these components. In such a case, a computing processing device other than the simulating apparatus 10 includes the illumination shape distribution information input unit 11, the positional information input unit 12, and the illumination shape calculating unit 14, and the computing processing device calculates the illumination shape corresponding to the positional information. The simulating apparatus 10 executes lithography simulation based on the illumination shape calculated by the computing processing device and the contour data.

Figure 4:
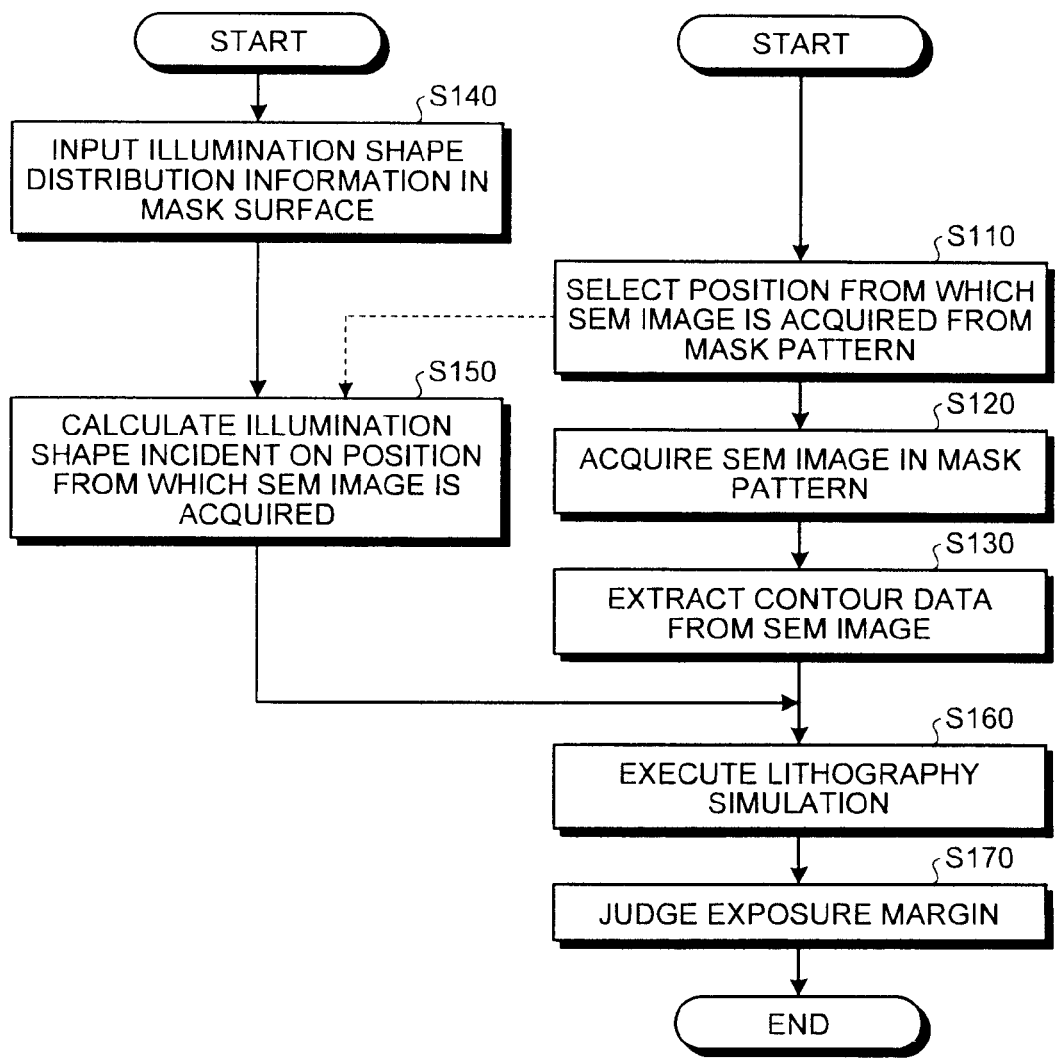
FIG. 4 is a flowchart of the operation procedure of the simulating apparatus according to the first embodiment shown in FIG. 1.

An operation procedure of the simulating apparatus 10 according to the first embodiment will be explained. FIG. 4 is a flowchart of the operation procedure of the simulating apparatus 10 according to the first embodiment.

The mask 30 used in lithography simulation of the present embodiment is a transmissive mask such as an ArF halftone (HT) mask. A hot spot (a position from which an SEM image is acquired) is previously selected in a mask pattern (Step S110).

The hot spot is obtained by specifying a portion (a position) with a small lithography margin by lithography simulation on the entire surface of a chip from mask data after performing optical proximity correction (OPC) on design data. A single or a plurality of hot spots is extracted in advance.

First, the mask 30 is set on the SEM 40, and the SEM 40 extracts an SEM image of the hot spot (Step S120). Then, the SEM 40 extracts contour data of a pattern contour from the SEM image by predetermined contour extraction software (a computer program that extracts a pattern contour of an SEM image) (Step S130). The contour data acquired by the SEM 40 is input to the contour data input unit 13 of the simulating apparatus 10. The contour data input unit 13 sends the contour data to the lithography simulating unit 15.

Figure 5A:
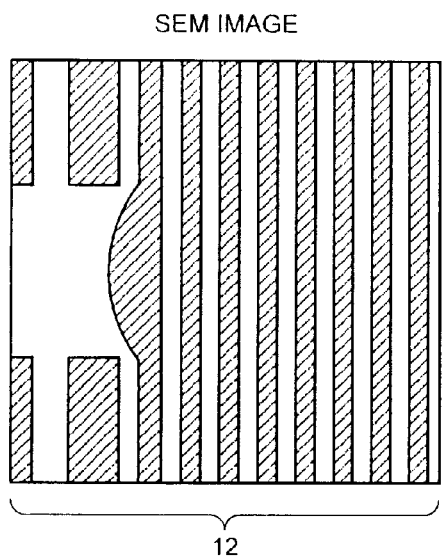
FIG. 5A is a schematic for explaining an SEM image.
Figure 5B:
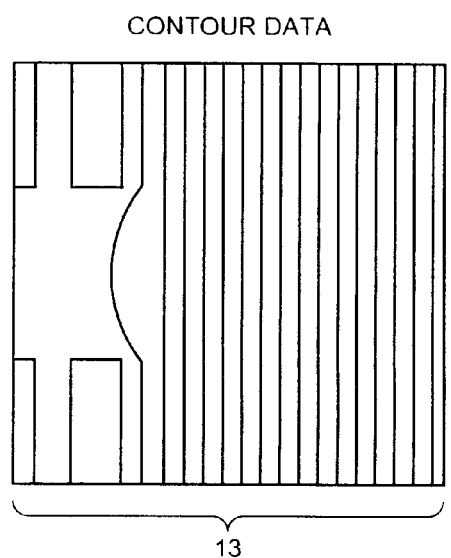
FIG. 5B is for showing an example of contour data of a mask pattern extracted from the SEM image.

FIGS. 5A and 5B are schematics for explaining the SEM image and the contour data. FIG. 5A is a schematic of the SEM image, and FIG. 5B is a schematic of the contour data of a mask pattern extracted from the SEM image.

The illumination shape distribution information 51 of the exposure apparatus 20 in which the mask 30 is set is acquired. The illumination shape distribution information 51 is measured, for example, by an illumination shape measurement tool of the exposure apparatus 20.

Figure 6:
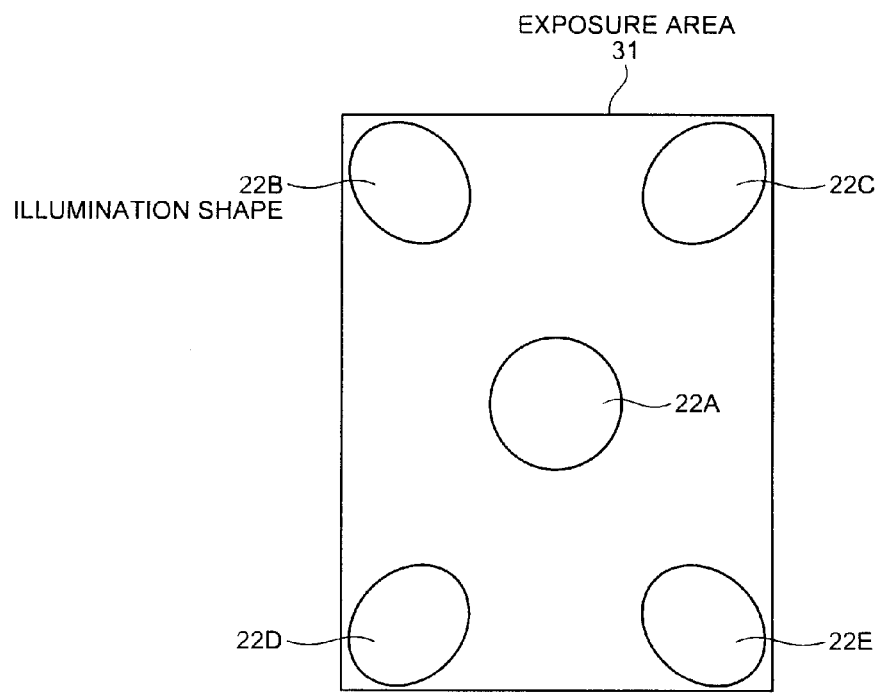
FIG. 6 is a schematic for explaining an illumination shape distribution in a transmissive mask surface.

FIG. 6 is a schematic for explaining an illumination shape distribution in a transmissive mask surface. In FIG. 6, an illumination shape corresponding to an exposure position is schematically shown with the center of the exposure area as a reference. The mask 30 includes an exposure area 31 having a size of 33 millimeters×26 millimeters, for example. An illumination shape 22A positioned at the center of the exposure area 31 (the mask 30) has an orbicular-zonal shape of a substantially perfect circle. The illumination shape becomes an elliptical shape extending in the diagonal direction of the mask 30 toward a position closer to the four corners from the center of the exposure area 31. Accordingly, illumination shapes 22B to 22E positioned at the four corners of the exposure area 31 are different from the illumination shape 22A by about 1% in a ratio of the major axis and the minor axis.

Figure 7A:
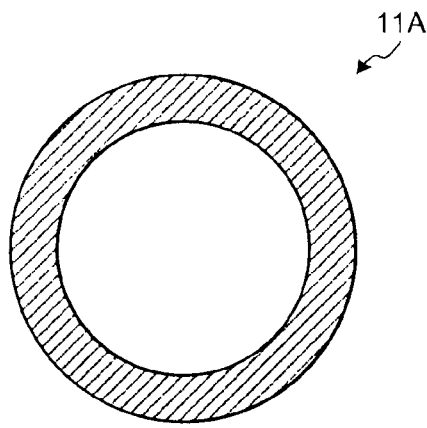
FIG. 7A is a schematic of an illumination source shape when an orbicular zone illumination is used.
Figure 7B:
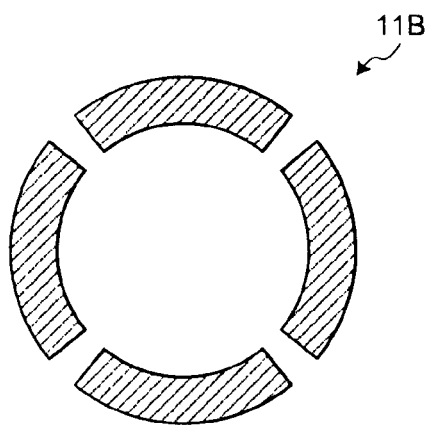
FIG. 7B is a schematic of an illumination source shape when a four-eye illumination is used.
Figure 7C:
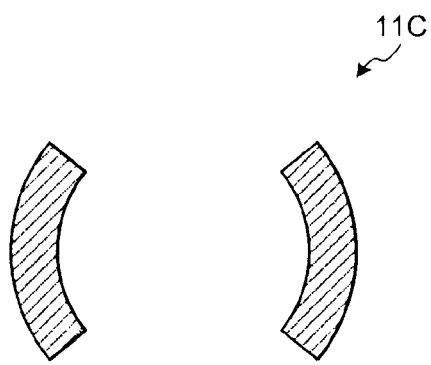
FIG. 7C is a schematic of an illumination source shape when a dipole illumination is used.

The illumination shapes 22B to 22E are different depending on the type of an illumination source shape (an illuminating device) used for irradiating the mask 30 with exposure light from the exposure apparatus 20. FIGS. 7A to 7C are schematics for explaining the types of the illumination source shape used in the exposure apparatus. FIG. 7A is a schematic of an illumination source shape 11A when an orbicular zone illumination is used. FIG. 7B is a schematic of an illumination source shape 11B when a four-eye illumination device (a quadrupolar illumination device) is used. FIG. 7C is a schematic of an illumination source shape 11C when a dipole illumination device (a bipolar illumination device) is used.

In fabricating a semiconductor device, an illumination source shape suited to each semiconductor device manufacturing step is selected. In other words, the type of an illumination source shape used in the exposure apparatus 20 is selected for each layer processed at the semiconductor device manufacturing step. Different illumination source shapes produce different illumination shapes. Accordingly, the illumination shape measurement tool previously acquires the illumination shape distribution information 51 for each illumination source shape (for each layer).

The illumination shape distribution information 51 is input to the illumination shape distribution information input unit 11 of the simulating apparatus 10 (Step S140), and the positional information (positional coordinates) of the position from which the SEM image has been acquired is input to the positional information input unit 12. The positional information input unit 12 sends the positional information to the illumination shape calculating unit 14, and the illumination shape distribution information input unit 11 sends the illumination shape distribution information 51 to the illumination shape calculating unit 14.

The illumination shape calculating unit 14 derives an illumination shape at a position from which the SEM image has been acquired based on the positional information and the illumination shape distribution information 51. The illumination shape at the position from which the SEM image has been acquired is an illumination shape incident on a pattern position on the mask corresponding to the position from which the SEM image has been acquired (Step S150). The illumination shape calculating unit 14 sends the obtained illumination shape to the lithography simulating unit 15.

The lithography simulating unit 15 executes lithography simulation based on the illumination shape from the illumination shape calculating unit 14 and the contour data from the contour data input unit 13. Accordingly, the lithography simulating unit 15 performs lithography simulation of the mask 30 under optical conditions used in wafer exposure (Step S160). The lithography simulating unit 15 sends the simulation result to the mask pattern dimension judging unit 16.

The mask pattern dimension judging unit 16 judges whether the mask pattern of the mask 30 has a desired dimension based on the simulation result (Step S170). In other words, in the present embodiment, the lithography simulation is performed using information about irregularity of illumination, and it is determined whether desired exposure latitude can be obtained (whether a predetermined exposure margin is secured) based on the simulation result. Thereafter, a semiconductor device is fabricated using the mask 30 judged to be accepted by the mask pattern dimension judging unit 16 and the exposure apparatus 20.

FIG. 8 is a schematic for explaining a relationship between a mask pattern and an exposure margin. In the graph shown in the upper half of FIG. 8, the vertical axis indicates light intensity on a wafer, and the horizontal axis indicates a position on the wafer. The lower half of FIG. 8 is a schematic of a light shield (an absorber) 25 as a mask pattern of the mask 30. The horizontal axis (position) in the graph shown in the upper half corresponds to a position of the light shield 25 in the a2-b2 direction.

In the graph shown in the upper half, the light intensity changes in a wave shape according to the position of the light shield 25. For example, because the light shield 25 does not transmit exposure light, a portion on the wafer corresponding to the position of the light shield 25 is irradiated with exposure light having low intensity. On the other hand, because the area where no light shield 25 is arranged in the mask 30 transmits exposure light, a portion on the wafer other than that corresponding to the position of the light shield 25 is irradiated with exposure light having high intensity.

For example, when a wafer is developed using a positive resist, a pattern at a position exposed by light having intensity lower than a slice level remains as a resist pattern, and a pattern at a position exposed by light having intensity equal to or higher than the slice level is removed. Accordingly, the resist pattern according to the mask pattern (the light shield 25) of the mask 30 is formed on the wafer.

The center of the mask 30 is irradiated with exposure light of the illumination shape 22A of an orbicular-zonal shape of a substantially perfect circle. The light intensity distribution at this time has such a large exposure margin as a distribution i1, for example. On the other hand, the end of the mask 30 is irradiated with exposure light of the illumination shapes 22B to 22D having an elliptical shape. The light intensity distribution at this time has such a small exposure margin as a distribution i2, for example.

In other words, when the exposure amount changes, the light intensity distribution of FIG. 8 moves up and down within the range specified in FIG. 8 while maintaining the distribution shape corresponding to the change, but as compared with the distribution i1, when the exposure amount changes, the distribution i2 shows a larger change at a position of an intersection with the slice level (the horizontal axis of FIG. 8). The position of the intersection with the slice level indicates the contour position of a pattern to be transferred. Accordingly, as compared with the distribution i1, the distribution i2 shows a larger change in a transcription pattern corresponding to a change in the exposure amount, and the exposure amount margin is determined to be low.

Because the illumination shapes of the center and the end of the mask 30 are different from each other, the exposure margins are also different therebetween. Because lithography simulation is performed by using information about irregularity of the illumination shape in the present embodiment, it is possible to determine accurately whether desired exposure latitude can be obtained.

A specific processing example of lithography simulation according to the first embodiment will be explained. First, an ArF half tone mask fabricated by a general photomask manufacturing process was prepared as the mask 30. The ArF halftone mask for example had a mask pattern to be used in fabricating a memory device of a 45-nm design rule formed thereon.

Sixty four hot spots were extracted in the mask pattern of the ArF halftone mask. Thereafter, the ArF halftone mask was set on a high definition SEM (NGR 4000) manufactured by NanoGeometry Research Inc., and an SEM image of the hot spot was acquired. The NGR 4000 acquires a high definition image of 8000×8000 pixels, and provides a high resolution with a pixel size of 2 nanometers on a mask. In other words, the view of an acquired SEM image has a 16-μm angle, which is large enough to perform lithography simulation.

A contour of a pattern was extracted with contour extraction software (manufactured by NanoGeometry Research Inc.) from the acquired SEM image to acquire contour data. Then, the illumination shape distribution information 51 of the exposure apparatus 20 in which the mask 30 is to be set was prepared.

An illumination shape of the position from which the SEM image had been acquired was obtained from the positional information of the position from which the SEM had been acquired and the illumination shape distribution information 51, and the obtained illumination shape and the contour data were input to the lithography simulating unit 15. The lithography simulating unit 15 performed lithography simulation on the mask 30 using the illumination shape and the contour data.

As a result of the lithography simulation, it was found that the latitude of the exposure amount necessary for obtaining a desired pattern dimension on the wafer was 8%, and the latitude of a focus depth therefor that is a focus range of tolerance of deviation of a focus position was 0.21 micrometers. The latitude of the exposure amount necessary for the prepared ArF halftone mask was 10%, and the latitude of the focus depth therefor was 0.2 micrometers. Accordingly, the position of the hot spot of the ArF halftone mask at this time did not meet the specification in terms of the latitude of the exposure amount, and the ArF halftone mask was rejected.

For comparison between the conventional lithography simulation and the lithography simulation of the present embodiment, a case of executing the conventional lithography simulation with the same illumination shape as that of the present embodiment will be explained. When the conventional lithography simulation was executed, the calculated latitude of the exposure amount was 11%, and the calculated latitude of the focus depth was 0.23 micrometers; therefore, the mask 30 was judged to be accepted.

Then, a resist pattern was actually formed on a wafer using the prepared ArF halftone mask. A liquid immersion exposure apparatus (manufactured by Nikon Corporation) was used as the exposure apparatus 20, and NA was 0.92. A polarized illumination device was employed as the exposure apparatus 20. As a result, the latitude (range) of the exposure amount with which a desired dimension could be obtained was 8%, and the latitude of the focus depth therefor was 0.22 micrometers. Thus, accurate lithography simulation can be performed by taking irregularity of the illumination shape into consideration, and the accuracy of judging acceptance of a mask can be improved. The yield of semiconductor devices fabricated by using the mask 30 judged to be accepted according to the present embodiment was confirmed to be improved remarkably as compared with semiconductor devices fabricated using a mask with a pattern whose dimension was judged by the conventional lithography simulation.

Embodiments of the present invention are not limited to the above-described embodiment. For example, information about a sidewall angle of a mask pattern (the dimension and the degree of the sidewall angle) may be added to the contour data of the pattern. The shape of a mask pattern (an SEM image) may be obtained from a three-dimensional SEM. The mask 30 is not limited to an ArF halftone mask, but may be other types of transmissive masks.

In the present embodiment, the pattern dimension of the mask 30 is judged based on a simulation result of the lithography simulation. Alternatively, the lithography simulation according to the present embodiment may be used in a process of generating mask pattern data from a design pattern to be formed on a wafer in a stage prior to creating the mask 30. In this case, the simulating apparatus 10 performs lithography simulation using a mask pattern (mask pattern data) serving as design data of the mask 30 and the illumination shape distribution information 51. Then, the result of the lithography simulation and the design pattern to be formed on the wafer are compared and verified. When the result of the verification shows that the difference between them exceeds the tolerance, the mask pattern data is corrected (for example, by the OPC).

The verification process and the correction process are repeated until the difference between the result of the lithography simulation and the design pattern to be formed on the wafer falls within the tolerance, and when the difference falls within the tolerance, the mask pattern data at the time is specified as the design data of the mask 30.

Accordingly, a pattern having a desired dimension can be formed on a wafer by lithography using the mask 30 because a mask pattern formed by taking irregularity of the illumination shape of the exposure apparatus into consideration has been formed on the mask 30. In this example, the verification is performed based on the difference between the result of the lithography simulation and the design pattern to be formed on the wafer; however, the verification may be based on whether the result of the lithography simulation has predetermined process latitude.

The optical image intensity distribution is distribution in the wafer surface of light intensity of exposure light incident on a wafer when the mask pattern formed on the mask 30 is exposed on the wafer. The simulating apparatus 10 calculates the optical image intensity distribution of exposure light incident on the wafer using an optical image intensity distribution acquisition computer program (a computer program product). As explained above, the simulating apparatus 10 may calculate a pattern to be transferred on a wafer by setting a predetermined threshold (a slice level) in the optical image intensity distribution.

The simulation program 7 and the mask pattern test program 8 executed in the simulating apparatus according to the present embodiment may be previously incorporated in a ROM or the like. Alternatively, the simulation program 7 and the mask pattern test program 8 may be recorded on a computer readable medium such as a CD-ROM, a flexible disk (FD), a CD-R, and a digital versatile disk (DVD) in a file format that can be installed in a computer or executed by a computer.

Furthermore, the simulation program 7 and the mask pattern test program 8 may be stored in a computer connected to a network such as the Internet to be downloaded to another computer via the network. Moreover, the simulation program 7 and the mask pattern test program 8 may be provided or distributed via a network such as the Internet.

In the present embodiment, lithography simulation is performed on a resist pattern after development; however, the lithography simulation may be performed on a pattern after etching. In the present embodiment, after contour data is acquired (after the processing of Step S130), the illumination shape distribution information 51 is input to the illumination shape distribution information input unit 11 (Step S140). However, the illumination shape distribution information 51 may be input to the illumination shape distribution information input unit 11 before the contour data is acquired. In addition, the lithography simulation by the simulating apparatus 10 and judgment of acceptance of the mask 30 may be modified variously within a range not departing from the spirit of the present embodiment.

Because the simulating apparatus 10 performs lithography simulation using information about irregularity of illumination, lithography simulation can be executed while taking influence of the irregularity of illumination, which has been a problem, into consideration. Accordingly, the result of the lithography simulation and the result of exposure on the wafer can be matched, and the dimension of a mask pattern can be judged to be accepted or not accurately. The lithography simulation can be performed accurately on the optical image intensity distribution of a mask pattern. Accordingly, the yield of manufactured semiconductor devices is improved by performing exposure processing of a wafer using a mask judged to be accepted. In the present embodiment, a pattern dimension of a mask pattern and an optical image intensity distribution can be tested accurately.

Second Embodiment

The second embodiment will be explained with reference to FIGS. 9 to 12. In the second embodiment, lithography simulation of an EUV mask (an EUV exposure mask) is performed. The simulating apparatus 10 according to the second embodiment has a same configuration and a function the same as those of the simulating apparatus 10 according to the first embodiment explained with FIGS. 2 and 3, and therefore is not explained here.

The mask 30 in the present embodiment is a reflective mask such as the EUV mask. The mask 30 has an EUV light reflecting film made of a multilayer which has Mo and Si layer pair and on which a mask pattern is formed by an EUV light absorber (the light shield 25) whose main component is Ta.

The exposure apparatus 20 in the present embodiment is a scan-type reflective wafer exposure apparatus. The exposure apparatus 20 performs exposure of EUV light having a wavelength of, for example, 13 nanometers on a wafer. The exposure apparatus 20 makes EUV light incident on the mask 30, and performs exposure using reflected light from the mask 30. At this time, the incidence direction of EUV light incident on the mask 30 is different at each position (coordinates) on the surface of the mask 30. Accordingly, lithography simulation brings an erroneous result when the lithography simulation is performed by ignoring the position on the mask surface from which an SEM image has been acquired. In the present embodiment, lithography simulation is performed by using an incidence direction of EUV light at the position on the mask surface from which the SEM image has been acquired.

Figure 9:
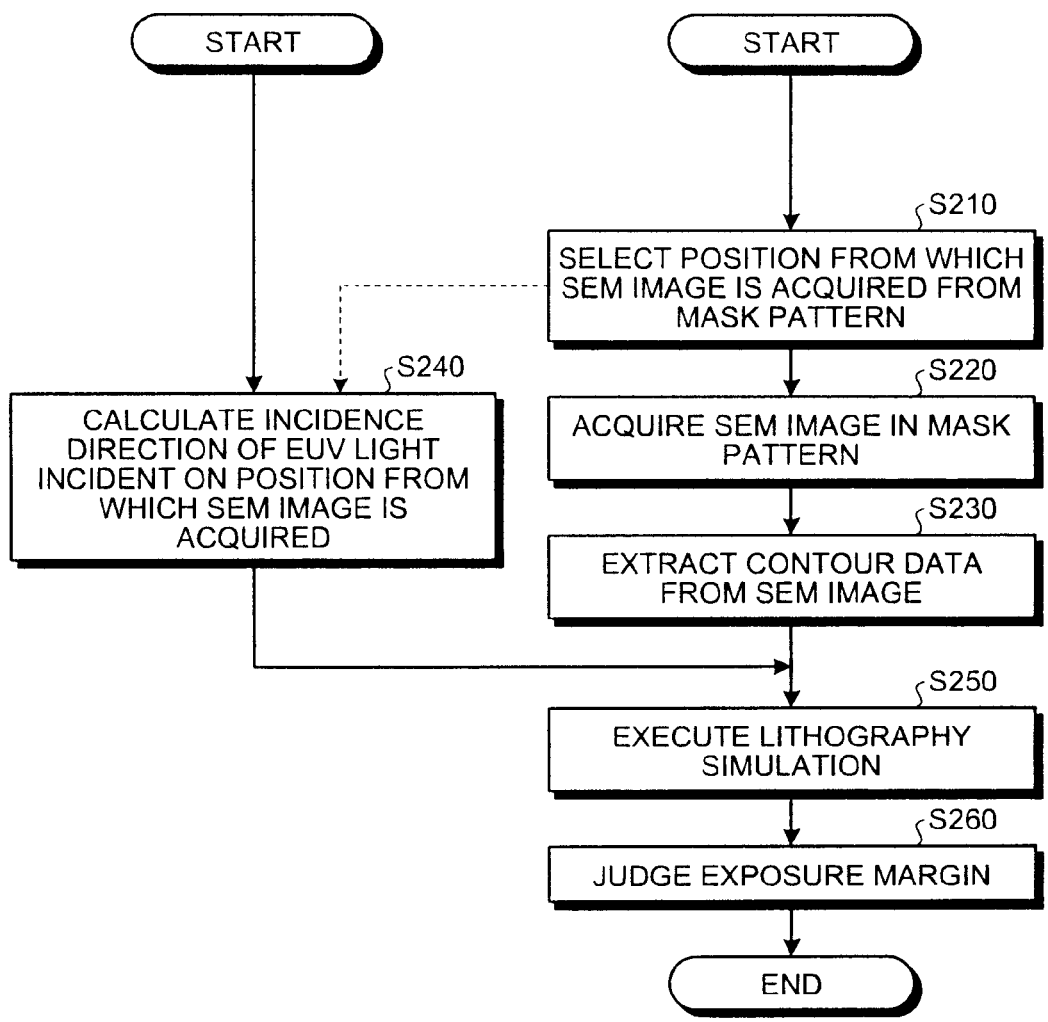
FIG. 9 is a flowchart of operation procedure of a simulating apparatus according to a second embodiment.

Operation procedure of the simulating apparatus 10 according to the present embodiment will be explained. FIG. 9 is a flowchart of the operation procedure of the simulating apparatus according to the second embodiment. Processing of the operation the same as that of the simulating apparatus 10 according to the first embodiment shown in FIG. 4 will not be explained.

A hot spot is previously selected in a mask pattern of the mask 30 (Step S210). The mask 30 is set in the SEM 40, and an SEM image of the hot spot is acquired by the SEM 40 (Step S220). Then, the SEM 40 extracts contour data of the pattern contour from the SEM image (Step S230). The contour data acquired by the SEM 40 is input to the contour data input unit 13 of the simulating apparatus 10. The contour data input unit 13 sends the contour data to the lithography simulating unit 15.

The illumination shape distribution information 51 of the exposure apparatus 20 in which the mask 30 is set is then acquired. Here, the illumination shape distribution information 51 is information about an output direction of exposure light irradiated from the exposure apparatus 20 and information about the shape of an exposure area, and is used to calculate the incidence direction of EUV light at the hot spot in the mask surface. The incidence direction of the EUV light corresponds to the illumination shape explained in the first embodiment, and as the incidence direction of the EUV light changes, the resist pattern formed on the wafer changes.

The illumination shape distribution information 51 is input to the illumination shape distribution information input unit 11 of the simulating apparatus 10, and the information of the position from which the SEM has been acquired is input to the positional information input unit 12. The positional information input unit 12 sends the positional information to the illumination shape calculating unit 14, and the illumination shape distribution information input unit 11 sends the illumination shape distribution information 51 to the illumination shape calculating unit 14.

The illumination shape calculating unit 14 calculates the incidence direction of the EUV light at the position from which the SEM image has been acquired based on the positional information and the illumination shape distribution information 51 (Step S240). The incidence direction of the EUV light at the position from which the SEM image has been acquired (the illumination condition) is the incidence direction of exposure light, which the pattern position on a mask corresponding to the position from which the SEM position has been acquired is irradiated with. The illumination shape calculating unit 14 sends the obtained incidence direction to the lithography simulating unit 15.

Figure 10:
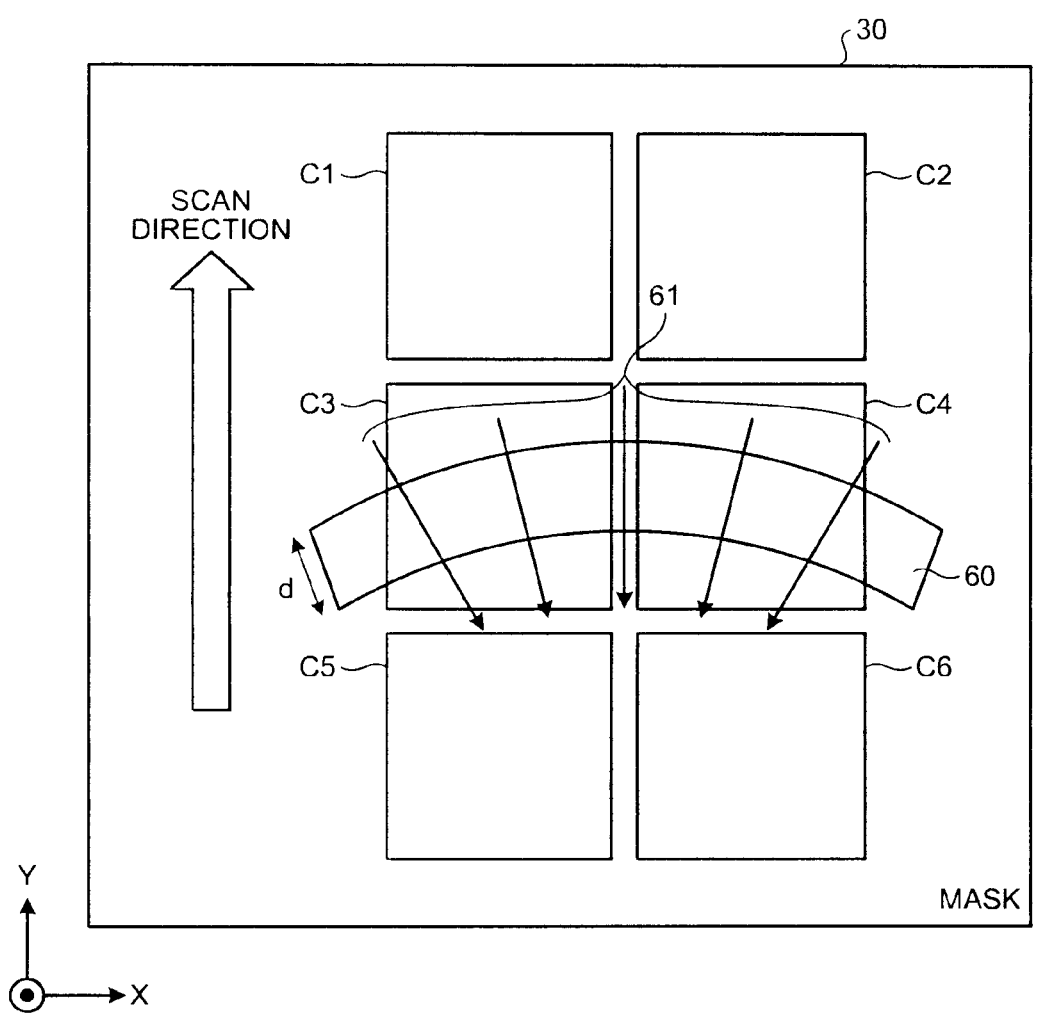
FIG. 10 is a schematic for explaining an incidence angle of EUV light within a reflective mask surface.

FIG. 10 is a schematic for explaining the irradiation direction of the EUV light within the reflective mask surface, and the mask 30 is seen from the top surface in the figure. In FIG. 10, six chips C1 to C6 are arranged in the mask 30, and exposure of a wafer is performed as an arc EUV light irradiation area 60 scans the mask 30. Here, the scan direction on the mask 30 is the Y-axis direction, the direction in the mask surface perpendicular to the scan direction is the X-axis direction, and the vertical direction perpendicular to the X-Y surface is the Z-axis direction.

The EUV light irradiation area 60 is an arc area having a width d that is formed by curving a zonal area to form an arc within the surface of the mask 30 (a sectorial area without its center). The scan width of the EUV light irradiation area 60 (a dimension in the X-axis direction) is larger than the sum of the dimension of the chip C1 in the X-axis direction and the dimension of the chip C2 in the X-axis direction.

The EUV light (the exposure light) 61 is incident on the mask 30 in the direction the same as the scan direction at the center of the EUV light irradiation area 60 in the X-axis direction (the boundary between the chip C1 and the chip C2). The EUV light incident on the mask 30 deviates from the scan direction (the Y-axis direction) at the EUV light irradiation area 60 as it becomes farther from the center in the X-axis direction and closer to the either of the two ends in the X-axis direction. In other words, because the incidence direction of the EUV light 61 to the mask 30 changes along the arc of the EUV light irradiation area 60 as shown in FIG. 10, the EUV light 61 is incident parallel to the scan direction on the pattern near the center. On the other hand, the incidence direction of the EUV light 61 incident on the pattern positioned at the end of the EUV light irradiation area 60 is not parallel to the scan direction, but is inclined slightly toward the center of the mask 30.

Figure 11:
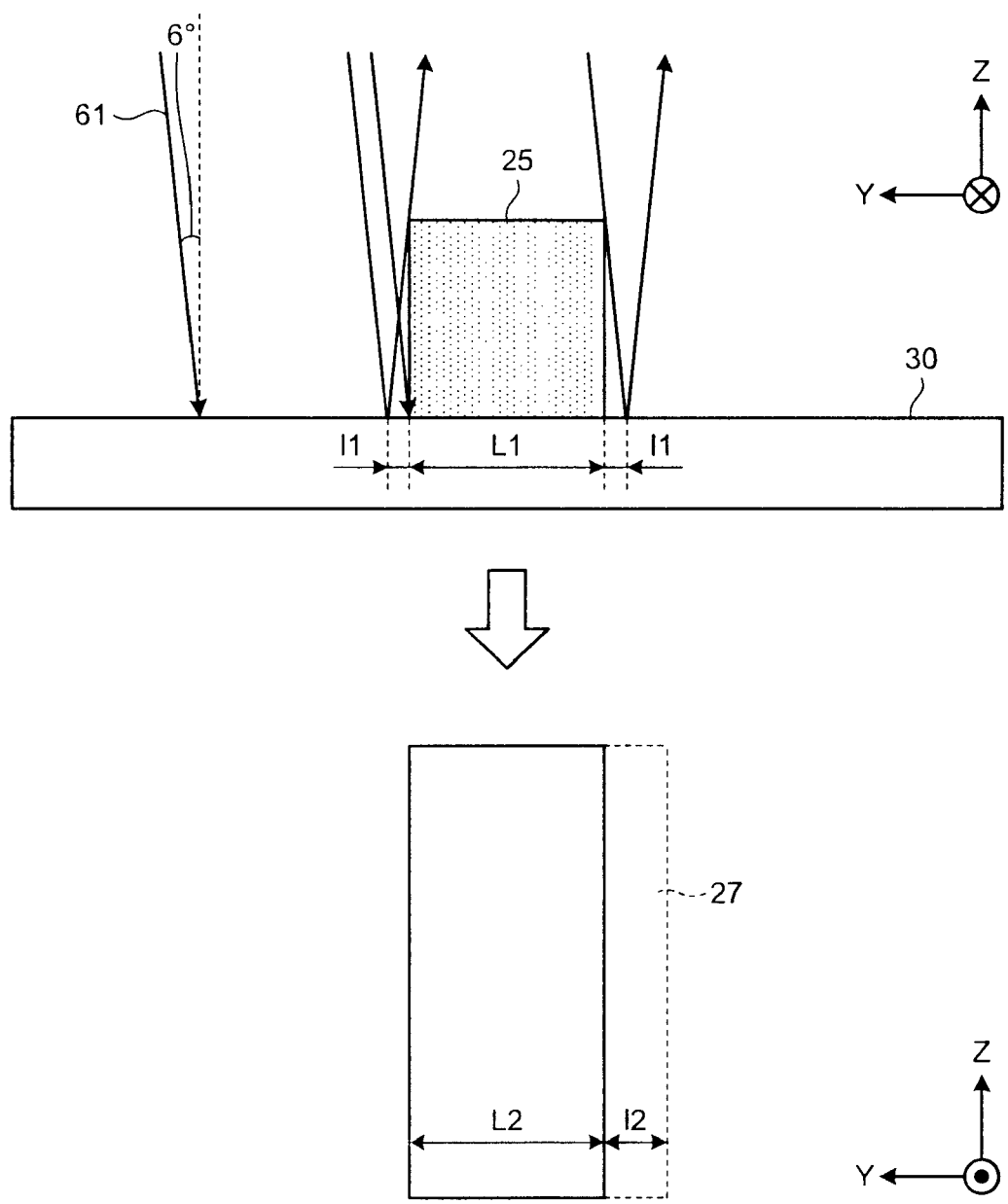
FIG. 11 is a schematic for explaining influence of an incidence direction of EUV light on a dimension of a resist pattern.

FIG. 11 is a schematic for explaining the influence of the incidence direction of the EUV light on the dimension of the resist pattern. In the upper half of FIG. 11, a cross section of the mask 30 is shown, and in the lower half of FIG. 11, a top view of the resist pattern 26 formed on the wafer is shown. The Y-axis direction of FIG. 11 is the scan direction. As shown in the cross section of the mask 30, the incidence angle of the EUV light 61 from the top surface direction of the mask 30 is constant at about 6° from the Z-axis direction.

When the EUV light 61 is incident on the mask 30 at an inclination angle of 0°, a pattern (EUV light) 26 having a substantially the same shape as the pattern of the light shield 25 is projected on the wafer with a reduced size. However, because the incidence angle of the EUV light 61 is inclined with respect to the Z-axis by 6° in the Y-Z surface, a pattern having a different shape from the light shield 25 is projected on the wafer with a reduced size. This is due to the presence of an area on mask 30 that cannot reflect the EUV light 61 to the wafer side, other than the area of the light shield 25 (hereinafter, a "non-reflection area"). The non-reflection area is an area obtained by extending the bottom surface of the light shield 25 in the Y-axis direction (the positive direction and the negative direction) (the dimension in Y-axis direction is l1), and is determined by the incidence angle of the EUV light 61 and the height of the light shield 25.

In other words, the EUV light 61 incident on the mask 30 includes a part that cannot reach the upper side of the light shield 25 by being absorbed by the side (the X-Z surface) of the light shield 25, although the part is reflected by the top surface of the mask 30 (other than the light shield 25). The non-reflection area that generates such a part of the EUV light 61 is the non-reflection area that is generated in the positive Y direction.

The EUV light 61 that is incident on the mask 30 includes a part that cannot reach the reflection surface of the mask 30 because the EUV light 61 is incident on the mask 30 in an inclined direction. The part of the EUV light 61 reaches the mask 30 if the EUV light 61 is incident on the mask 30 from the vertical direction, but the part is absorbed by the top surface of the light shield 25 because the EUV light 61 is incident on the mask 30 in an inclined direction. The non-reflection area that generates such a part of the EUV light 61 is the non-reflection area that is generated in the negative Y direction.

Thereby, in the mask 30, the area in contact with the bottom of the light shield 25, and the non-reflection area in accordance with the incidence angle of the EUV light 61 do not reflect the EUV light 61. The bottom of the light shield 25 has a dimension in the range of L1 in the Y-axis direction, and the non-reflection areas on the positive Y side and the negative Y side have a dimension of l1 in the Y-axis direction.

When the EUV light 61 is incident on the mask 30 in the vertical direction, the resist pattern 26 having a dimension of L2 in the Y-axis direction is formed on the wafer. The resist pattern 26 has a shape the same as the pattern shape of the light shield 25, and in the case of 4-fold reduction projection, L2=4×L1.

In the present invention, because the EUV light 61 is incident on the mask 30 in an inclined direction, the resist pattern 27 in accordance with the non-reflection area is formed on the wafer. The resist pattern 27 has a dimension of l2 in the Y-axis. The resist pattern 27 has a shape the same as that of the non-reflection area. Because the non-reflection area is generated in both the positive Y side and the negative Y side, in the case of 4-fold reduction projection, l2=2×4×l1.

Thereby, the resist patterns 26, 27 corresponding to the shape of the light shield 25, and the shape of the non-reflection area are formed on the wafer. The resist patterns 26, 27 have a dimension of L2+l2 in the Y-axis direction.

Figure 12:
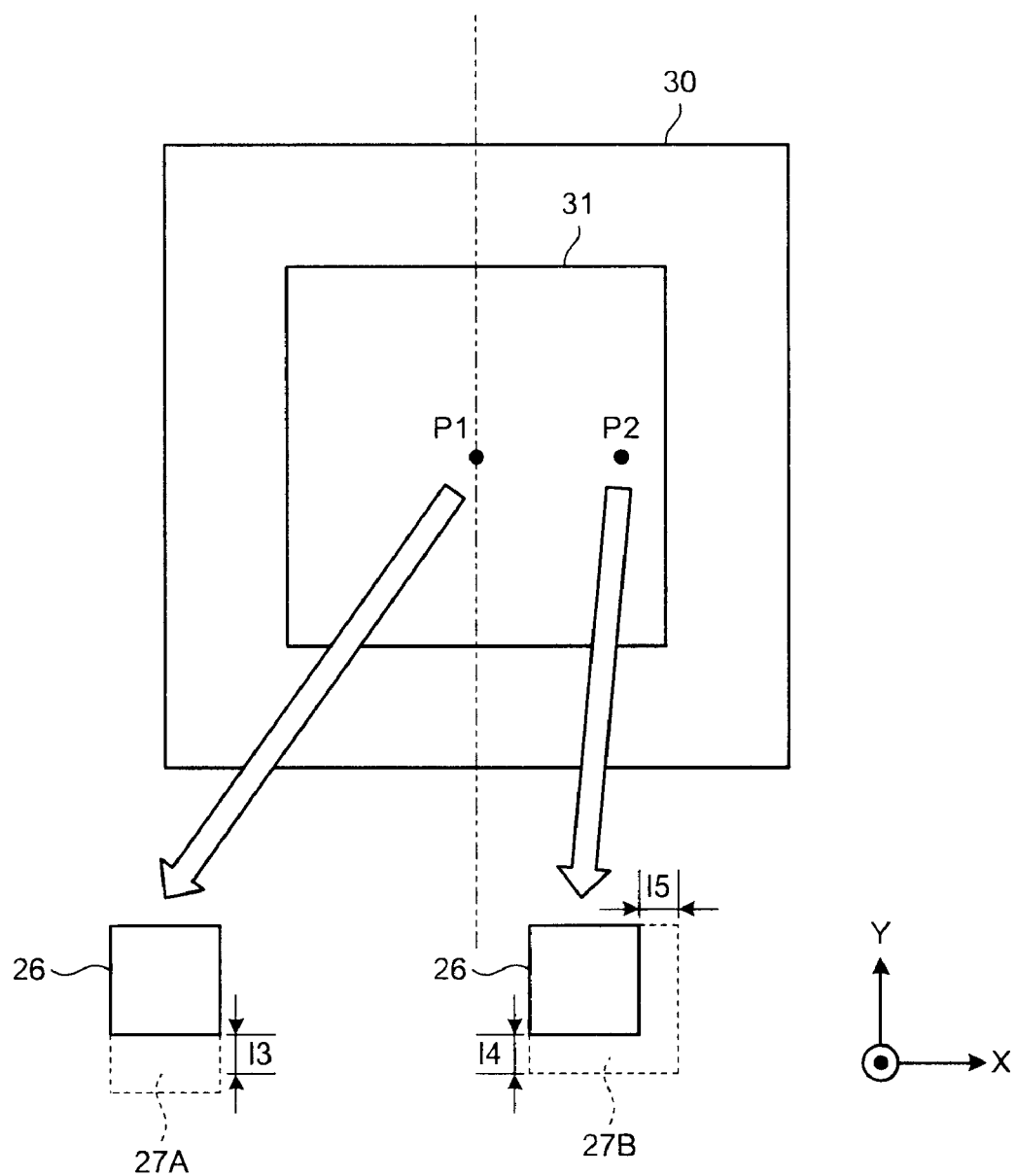
FIG. 12 is a schematic for explaining relationship between a position in an exposure area and a resist pattern dimension.

FIG. 12 is a schematic for explaining the relationship between a position in the exposure area and a resist pattern dimension. As explained with reference to FIG. 10, the EUV light 61 having various incidence angles in the X-Y surface is incident on the mask 30. As explained with reference to FIG. 11, the non-reflection area in accordance with an incidence angle of the EUV light 61 is generated on the exposure area 31.

Accordingly, the non-reflection areas at a center P1 of the exposure area 31, and a periphery P2 of the exposure area 31 have different shapes and dimensions. At the center P1 of the exposure area 31, the non-reflection area is generated in the Y-axis direction because the EUV light 61 parallel to the Y-axis is irradiated in the X-Y surface. On the other hand, at the periphery P2 of the exposure area 31, the non-reflection area is generated in both the Y-axis direction and the X-axis direction because the EUV light 61 inclined by a predetermined angle from the Y-axis is irradiated in the X-Y surface.

The component in the Y-axis direction of the EUV light 61 incident on the periphery P2 is smaller than the component in the Y-axis direction of the EUV light 61 incident on the center P1. Accordingly, a dimension l3 of the resist pattern 27A in the Y-axis direction formed by the non-reflection area of the center P1 is larger than a dimension l4 of the resist pattern 27B in the Y-axis direction formed by the non-reflection area of the periphery P2.

The EUV light 61 incident on the periphery P2 includes a component in the X-axis direction. On the other hand, the EUV light 61 incident on the center P1 does not include a component in the X-axis direction. Accordingly, depending on the non-reflection area of the center P1, the resist pattern 27A in the X-axis direction may not be formed. On the other hand, the resist pattern 26B formed by the non-reflection of the periphery P2 has a predetermined dimension of l5 in the X-axis direction.

As can be seen, because the incidence angles of the EUV light 61 are different at the center P1 and the periphery P2 of the mask 30, the resist patterns formed on the wafer are different at the center P1 and at the periphery P2. Accordingly, the exposure margins are different at the center P1 and the periphery P2 of the mask 30.

When the incidence angle of the EUV light 61 and the contour data as the illumination condition are input to the lithography simulating unit 15, the lithography simulating unit 15 performs lithography simulation based on the illumination condition and the contour data. Accordingly, the lithography simulating unit 15 performs lithography simulation of the mask 30 under the optical condition used in the wafer exposure (Step S250). The lithography simulating unit 15 sends the simulation result to the mask pattern dimension judging unit 16.

The mask pattern dimension judging unit 16 judges whether the mask pattern of the mask 30 has a desired dimension based on the simulation result (Step S260). In other words, in the present embodiment, lithography simulation is performed with information about the irregularity of the illumination (distribution of the incidence angle of the EUV light 61 in the mask surface), and it is determined whether desired exposure latitude can be obtained (whether a predetermined exposure margin is secured) based on the simulation result. As can be seen, because in the present embodiment, lithography simulation is performed by using information about irregularity of the incidence angle of the EUV light 61, it can be determined accurately whether desired exposure latitude can be obtained. Thereafter, a semiconductor device is fabricated using the mask 30 judged to be accepted by the mask pattern dimension judging unit 16 and the exposure apparatus 20.

A specific example of lithography simulation according to the second embodiment will be explained. First, an EUV mask manufactured by a general EUV mask manufacturing process was prepared as the mask 30. The pattern formed on the EUV mask is a memory device conforming to the 32-nm design rule, and portions with small lithography margins were extracted previously as hot spots. In this case, sixty four hot spots were extracted.

The prepared EUV mask was set in a high definition SEM (NGR 4000) manufactured by TOPCON TECHNOHOUSE CORPORATION, and a SEM image of the hot spot was acquired. The incidence direction of the EUV light at this position was calculated based on the position in the mask surface from which the SEM image had been acquired.

The incidence angle of the EUV light to the EUV mask was constant at about 6°. The incidence direction of the EUV light in the X-Y direction changes along the arc of the light irradiation area (the exposure area) 60. Accordingly, the EUV light parallel to the scan direction was incident on the pattern near the center of the EUV light irradiation area 60. On the other hand, the EUV light not parallel to the scan direction, but inclined by a predetermined angle to the mask center direction was incident on the pattern near the periphery of the EUV light irradiation area 60. Because the position of the SEM image acquired at this time was away from the scan center by 30 millimeters, the incidence direction was calculated to be inclined by 3.13°.

The contour data of the mask pattern was extracted from the acquired SEM image. The contour data and the information about the incidence angle of the EUV light were input to the simulating apparatus 10. The lithography simulating unit 15 performed lithography simulation under the optical condition of using the fabricated EUV mask in wafer exposure.

As a result of the lithography simulation, it was found that the latitude of the exposure amount necessary for obtaining a desired pattern dimension on the wafer was 8%, and the latitude of the focus depth therefor was 0.21 micrometers. The latitude of the exposure amount necessary for the prepared EUV mask was 10%, and the latitude of the focus depth therefor was 0.2 micrometers. Accordingly, the position of the hot spot of the EUV mask at this time did not meet the specification in terms of the latitude of the exposure amount, and the EUV mask was rejected.

For comparison between the conventional lithography simulation and the lithography simulation in the present embodiment, a case of executing the conventional lithography simulation with the same incidence direction of the EUV light as that in the present embodiment will be explained. Because when the conventional lithography simulation is executed, the latitude of the obtained exposure amount was 11%, and the latitude of the obtained focus depth was 0.23 micrometers, the EUV mask was judged to be accepted.

Then, the resist pattern was actually formed on the wafer using the prepared EUV mask. An EUV exposure apparatus (manufactured by Nikon Corporation) was used as the exposure apparatus. As a result, the latitude (range) of the exposure amount that could provide a desire dimension was 8%, and the latitude of the focus depth therefor was 0.22 micrometers. Thus, an accurate lithography simulation becomes possible, and the accuracy of judgment of acceptance of a mask can be improved by taking the incidence direction of the EUV light in the mask surface into consideration. Thereby, it was confirmed that the verification-test accuracy of a mask pattern of an EUV mask is improved, the yield of the EUV mask manufacturing is improved, and the yield of manufactured semiconductors using an EUV mask is remarkably improved.

The pattern generated on the EUV mask in the present embodiment may be generated previously with information about the incidence direction of the EUV light 61 (the distribution of the incidence in the surface). A case of judging the pattern dimension of the mask 30 based on the simulation result of lithography simulation is explained in the present embodiment. However, the OPC may be performed on the design data of the mask 30 using the simulation result. In the present embodiment, as in the first embodiment, the optical image intensity distribution of the exposure light incident on the wafer may be calculated by lithography simulation.

Furthermore, embodiments are not limited to the above-described embodiment. For example, the contour data extracted from the SEM image may be level line data from a three-dimensional SEM image. In addition, the lithography simulation by the simulating apparatus 10 and the judgment of acceptance of the mask 30 may be modified without departing from the spirit of the present embodiment.

As can be seen, according to the second embodiment, because the simulating apparatus 10 performs lithography simulation using information about irregularity of illumination, it becomes possible to match lithography simulation result. Thus, acceptance of the dimension of a mask pattern can be accurately judged. Lithography simulation on an optical image intensity distribution of a mask pattern can be performed accurately. Accordingly, the pattern dimension of a mask pattern and the optical image intensity distribution can be tested accurately.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical image intensity distribution acquisition method, the method comprising:
    acquiring an optical image intensity distribution of exposure light incident on a wafer when a mask pattern is exposed on the wafer performing lithography simulation of an optical image intensity distribution of the mask pattern using illumination condition information about a distribution of an illumination condition in a photomask surface of exposure light with which an exposure apparatus irradiates the mask pattern.

2. The optical image intensity distribution acquisition method according to claim 1, wherein the lithography simulation of the mask pattern is performed by using contour data of the mask pattern.

3. The optical image intensity distribution acquisition method according to claim 1, wherein the lithography simulation of the mask pattern is performed by using the contour data and information about a sidewall angle of the mask pattern.

4. A computer program product that includes computer program codes stored on a non-transitory computer readable recording medium that when executed on a computer enables the computer to execute:

acquiring an optical image intensity distribution of exposure light incident on a wafer when a mask pattern is exposed on the wafer, as a process of obtaining the optical image intensity distribution by lithography simulation, performing lithography simulation of an optical image intensity distribution of the mask pattern using illumination condition information about a distribution of an illumination condition in a photomask surface of exposure light with which an exposure device irradiates the mask pattern.

5. The computer program product according to claim 4, wherein the illumination condition information is information about an illumination shape of exposure light incident on and transmitted through the mask pattern.

6. The computer program product according to claim 4, wherein the illumination condition information is information about an incidence direction of exposure light incident on and reflected by the mask pattern.

* * * * *